US009967991B2

(12) United States Patent
Ichikawa

(10) Patent No.: US 9,967,991 B2
(45) Date of Patent: May 8, 2018

(54) SEMICONDUCTOR DEVICE AND BUSBAR

(71) Applicant: FUJI ELECTRIC CO., LTD., Kawasaki-shi, Kanagawa (JP)

(72) Inventor: Hiroaki Ichikawa, Azumino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 68 days.

(21) Appl. No.: 15/288,137

(22) Filed: Oct. 7, 2016

(65) Prior Publication Data
US 2017/0027074 A1    Jan. 26, 2017

Related U.S. Application Data

(63) Continuation of application No. PCT/JP2015/074456, filed on Aug. 28, 2015.

(30) Foreign Application Priority Data

Oct. 10, 2014    (JP) .................................. 2014-208743

(51) Int. Cl.
*H05K 7/02* (2006.01)
*H01L 25/07* (2006.01)
(Continued)

(52) U.S. Cl.
CPC ............ *H05K 7/026* (2013.01); *H01L 23/50* (2013.01); *H01L 23/5383* (2013.01);
(Continued)

(58) Field of Classification Search
CPC .................... H05K 2201/10272; H01R 9/2675
See application file for complete search history.

(56) References Cited

U.S. PATENT DOCUMENTS 5,808,240 A * 9/1998 Czerwinski ............. H01L 23/66
174/149 B
6,160,696 A * 12/2000 Bailey ................... H02M 7/003
361/100
(Continued)

FOREIGN PATENT DOCUMENTS

JP         2004-135444 A     4/2004
JP         2007-236044 A     9/2007
(Continued)

OTHER PUBLICATIONS

S. Haque et al., "An innovative technique for packaging power electronic building blocks using metal posts interconnected parallel plate structures," in IEEE Transactions on Advanced Packaging, vol. 22, No. 2, pp. 136-144, May 1999 , (http://ieeexplore.ieee.org/stamp/stamp.jsp?tp=&arnumber=763184).*

*Primary Examiner* — Charles Garber
*Assistant Examiner* — Alia Sabur
(74) *Attorney, Agent, or Firm* — Rabin & Berdo, P.C.

(57) ABSTRACT

A semiconductor device, including a plurality of semiconductor modules, each including a semiconductor element, a main terminal and a wiring portion that connects the semiconductor element and the main terminal, and at least one busbar that each includes a terminal portion, and a plurality of attachment portions, the attachment portions being respectively connected to the main terminals of the semiconductor modules, such that the at least one busbar connects the semiconductor modules in parallel. The largest resistance among all resistances between the terminal portion and each of the attachment portions in each busbar is 10% or less of a resistance of the wiring portion in each semiconductor module. The largest inductance among all inductances between the terminal portion and each of the attachment portions in each busbar is 10% or less of an
(Continued)

inductance of the wiring portion in each semiconductor module.

8 Claims, 7 Drawing Sheets

(51) Int. Cl.
*H01L 25/18* (2006.01)
*H05K 7/06* (2006.01)
*H01L 23/50* (2006.01)
*H01L 23/538* (2006.01)
*H02B 1/20* (2006.01)
*H01L 25/11* (2006.01)
*H02M 7/00* (2006.01)

(52) U.S. Cl.
CPC .......... *H01L 23/5384* (2013.01); *H01L 25/07* (2013.01); *H01L 25/18* (2013.01); *H02B 1/205* (2013.01); *H05K 7/06* (2013.01); *H01L 25/115* (2013.01); *H01L 2924/0002* (2013.01); *H02M 7/003* (2013.01); *H05K 2201/10272* (2013.01)

(56) References Cited

U.S. PATENT DOCUMENTS

| | | | | |
|---|---|---|---|---|
| 7,791,208 | B2* | 9/2010 | Bayerer | H01L 24/48 257/773 |
| 2004/0233690 | A1* | 11/2004 | Ledenev | H02M 3/1584 363/133 |
| 2007/0119820 | A1* | 5/2007 | Schilling | H01L 24/49 218/143 |
| 2012/0241953 | A1* | 9/2012 | Yamada | H01L 23/4334 257/737 |
| 2014/0008781 | A1 | 1/2014 | Nishi et al. | |
| 2014/0355219 | A1 | 12/2014 | Tada et al. | |

FOREIGN PATENT DOCUMENTS

| | | |
|---|---|---|
| JP | 2008-091809 A | 4/2008 |
| JP | 2009-105454 A | 5/2009 |
| JP | 2009-146933 A | 7/2009 |
| JP | 2014-017319 A | 1/2014 |
| JP | 2014-236150 A | 12/2014 |

* cited by examiner

SEMICONDUCTOR DEVICE AND BUSBAR

CROSS-REFERENCE TO RELATED APPLICATION

This application is a continuation application of International Application PCT/JP2015/074456 filed on Aug. 28, 2015 which designated the U.S., which claims priority to Japanese Patent Application No. 2014-208743, filed on Oct. 10, 2014, the entire contents of which are incorporated herein by reference.

BACKGROUND OF THE INVENTION

1. Field of the Invention

The present embodiments discussed herein are related to a semiconductor device and a busbar.

2. Background of the Related Art

Semiconductor devices configured by connecting a plurality of semiconductor modules including IGBT (Insulated Gate Bipolar Transistors), FWD (Free Wheeling Diodes) and the like in parallel are in widespread use.

Although the semiconductor modules in such semiconductor devices are electrically connected in parallel, in an actual circuit, the length of wiring from the power supply may differ between modules. When the length of wiring differs between semiconductor modules that are connected in parallel, this will produce a difference in inductance. This means that a large surge voltage can be produced at a semiconductor module when the module is turned off. Switching failures can also occur due to differences in switching waveforms. For this reason, a proposed semiconductor device has pairs of semiconductor modules to be connected in parallel connected to busbars disposed in parallel so that the positive and negative terminals of the modules face one another (see, for example, Japanese Laid-open Patent Publication No. 2004-135444).

However, with the semiconductor device according to the cited document, when a plurality of pairs of semiconductor modules to be connected in parallel are connected to busbars so as to face one another, the distance from the power supply to a pair of semiconductor modules will differ to the distance from the power supply to another pair of semiconductor modules. Since the resistance of the busbar will also differ according to such difference in the distances, the current in each pair of semiconductor modules will also differ.

SUMMARY OF THE INVENTION

According to one aspect, there is provided a semiconductor device including: a plurality of semiconductor modules each including a semiconductor element, a main terminal that is exposed to a periphery, and a wiring portion that connects the semiconductor element and the main terminal; and at least one busbar that includes one terminal portion and a plurality of attachment portions, which are connected to the main terminals, and connects the semiconductor modules in parallel, wherein a largest resistance out of resistances between the terminal portion and the respective attachment portions is 10% or less of a resistance of the wiring portion, and a largest inductance out of inductances between the terminal portion and the respective attachment portions is 10% or less of an inductance of the wiring portion.

The object and advantages of the invention will be realized and attained by means of the elements and combinations particularly pointed out in the claims.

It is to be understood that both the foregoing general description and the following detailed description are provided by way of example and explanatory and are not restrictive of the invention.

DETAILED DESCRIPTION OF THE INVENTION

Several embodiments will be described below with reference to the accompanying drawings.

First Embodiment

Figure 1:
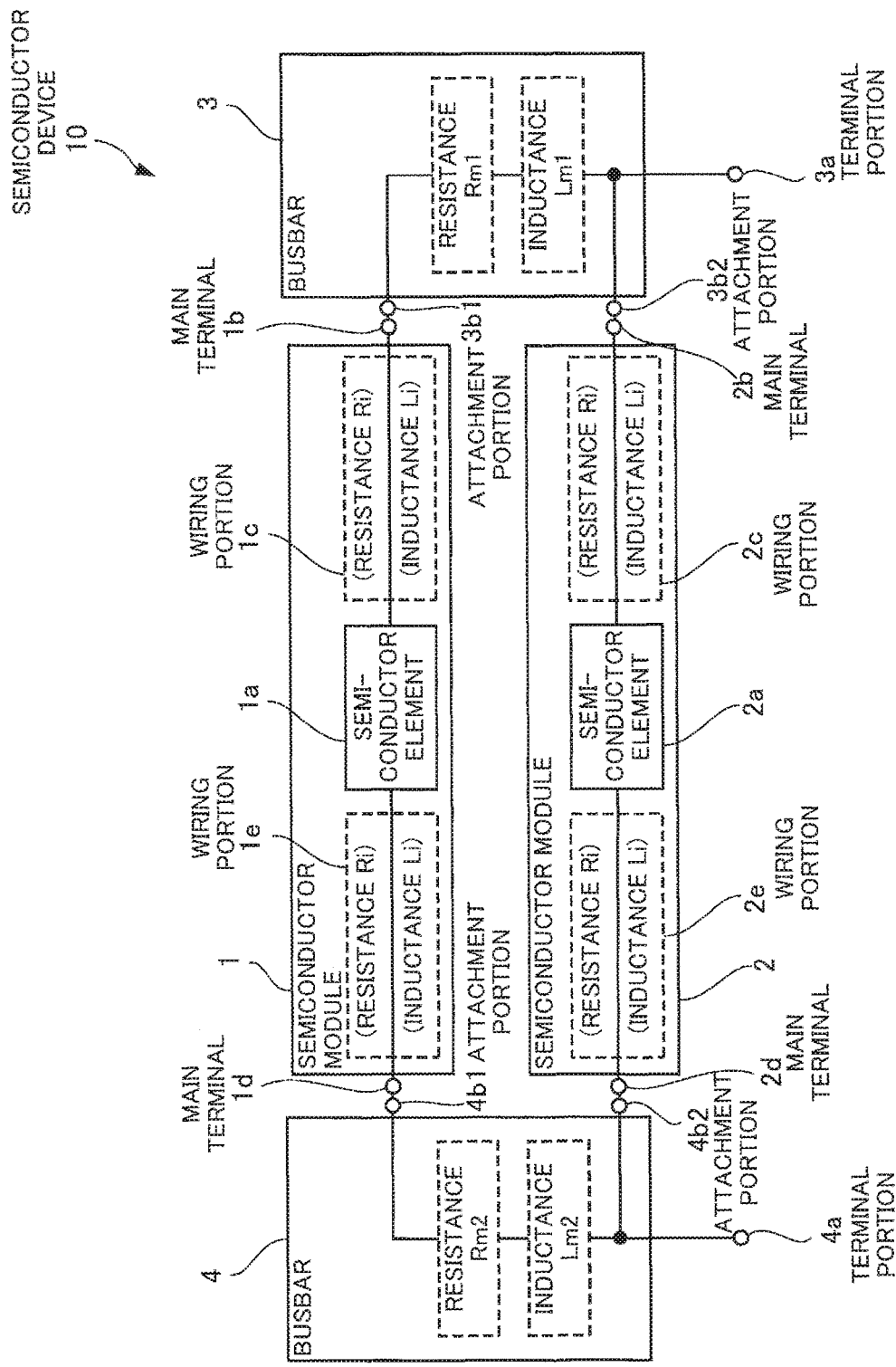
FIG. 1 depicts a semiconductor device according to a first embodiment.

FIG. 1 depicts a semiconductor device according to a first embodiment.

A semiconductor device 10 includes a plurality of semiconductor modules 1 and 2, and busbars 3 and 4 that electrically connect the plurality of semiconductor modules 1 and 2 in parallel. Note that in the semiconductor device 10, it is possible to electrically connect two or more semiconductor modules using the busbars 3 and 4. In the first embodiment, a configuration that uses the two semiconductor modules 1 and 2 is described.

The semiconductor module 1 includes a semiconductor element $1a$, main terminals $1b$ and $1d$ that extend to the outside, and wiring portions $1c$ and $1e$. In the same way, the semiconductor module 2 includes a semiconductor element $2a$, main terminals $2b$ and $2d$ that extend to the outside, and wiring portions $2c$ and $2e$.

As one example, the semiconductor elements $1a$ and $2a$ are power semiconductors. More specifically, the semiconductor elements $1a$ and $2a$ are each composed of one or a plurality out of an IGBT, a FWD, a power MOSFET (Metal Oxide Semiconductor Field Effect Transistor), or the like.

The main terminals $1b$ and $1d$ and main electrodes (not illustrated) of the semiconductor element $1a$ are electrically connected by the wiring portions $1c$ and $1e$. In the same way, the main terminals $2b$ and $2d$ and main electrodes (not illustrated) of the semiconductor element $2a$ are electrically connected by the wiring portions $2c$ and $2e$. The wiring portions $1c$, $1e$, $2c$, and $2e$ each have a resistance Ri and an inductance Li. Note that where are cases where the resistance Ri of each wiring portion $1c$, $1e$, $2c$, and $2e$ is referred to as the "internal resistance" of the semiconductor modules 1 and 2 and the inductance Li of each wiring portion $1c$, $1e$, $2c$, and $2e$ is referred to as the "internal inductance" of the semiconductor modules 1 and 2.

The busbar 3 is connected at an attachment portion $3b1$ to the main terminal $1b$ of the semiconductor module 1 and is connected at an attachment portion 3b2 to the main terminal 2b of the semiconductor module 2. The busbar 4 is connected at an attachment portion 4b1 to the main terminal 1d of the semiconductor module 1 and is connected at an attachment portion 4b2 to the main terminal 2d of the semiconductor module 2. The terminal portion 3a of the busbar 3 and the terminal portion 4a of the busbar 4 are also connected to an external power supply, not depicted.

Here, for currents flowing in the busbar 3, a resistance Rm1 and an inductance Lm1 are present between the terminal portion 3a and the attachment portion 3b1. On the other hand, the resistance and inductance between the terminal portion 3a and the attachment portion 3b2 are assumed to be negligible. That is, out of the respective resistances between the terminal portion 3a and the attachment portions 3b1 and 3b2, the larger resistance is the resistance Rm1. Also, out of the respective inductances between the terminal portion 3a and the attachment portions 3b1 and 3b2, the larger inductance is the inductance Lm1.

Also, a resistance Rm2 and an inductance Lm2 are present between the terminal portion 4a and the attachment portion 4b1 of the busbar 4. In the same way as the busbar 3, out of the respective resistances between the terminal portion 4a and the attachment portions 4b1 and 4b2, the larger resistance is the resistance Rm2. Also, out of the respective inductances between the terminal portion 4a and the attachment portions 4b1 and 4b2, the larger inductance is the inductance Lm2.

In the first embodiment, out of the resistances between the terminal portions 3a, 4a and the attachment portions 3b1, 3b2, 4b1, and 4b2 of the busbars 3 and 4, the largest resistances Rm1 and Rm2 are 10% or less of the resistance Ri of the wiring portions 1c, 1e, 2c, and 2e of the semiconductor modules 1 and 2. Out of the inductances between the terminal portions 3a, 4a and the attachment portions 3b1, 3b2, 4b1, and 4b2 of the busbars 3 and 4, the largest inductances Lm1 and Lm2 are 10% or less of the inductance Li of the wiring portions 1c, 1e, 2c, and 2e of the semiconductor modules 1 and 2.

Next, a case where a current flows to the semiconductor device 10 from an external power supply connected to the terminal portions 3a and 4a of the busbars 3 and 4 will be described.

At this time, the two resistances Ri of the wiring portions 1c and 1e and a resistance that is the sum of the resistances Rm1 and Rm2 of the busbars 3 and 4 are connected to the semiconductor element 1a of the semiconductor module 1. In the same way, the two inductances Li of the wiring portions 1c and 1e and an inductance that is the sum of the inductances Lm1 and Lm2 of the busbars 3 and 4 are connected to the semiconductor element 1a.

On the other hand, a resistance that is the sum of the resistances Ri of the wiring portions 2c and 2e is connected to the semiconductor element 2a of the semiconductor module 2. In the same way, an inductance that is the sum of the two inductances Li of the wiring portions 2c and 2e is connected to the semiconductor element 2a.

That is, when a voltage is applied from the terminal portions 3a and 4a of the busbars 3 and 4 to the semiconductor device 10, the resistance of the semiconductor module 1 is the sum of the resistance Rm1 and the resistance Rm2 higher than the resistance of the semiconductor module 2. In the same way, the inductance of the semiconductor module 1 is the sum of the inductance Lm1 and the inductance Lm2 higher than the inductance of the semiconductor module 2.

In particular, when it is possible to reduce the resistance Ri and the inductance Li of the semiconductor modules 1 and 2, the influence of the resistances Rm1 and Rm2 and the inductances Lm1 and Lm2 of the busbars 3 and 4 becomes especially prominent. That is, the current that flows to the semiconductor module 1 will be lower than the current flowing to the semiconductor module 2 in keeping with the extra resistances Rm1 and Rm2 and the inductances Lm1 and Lm2 described above. Here, even when it is possible to dispose the busbars 3 and 4 that connect the semiconductor modules 1 and 2 in parallel and reduce the influence of the inductances Lm1 and Lm2 of the busbars 3 and 4, it will still be difficult to reduce the influence of the resistances Rm1 and Rm2 of the busbars 3 and 4. This means that in the semiconductor module 1, due to the influence of the resistances Rm1 and Rm2 of the busbars 3 and 4 in particular, the flowing current is smaller than the current flowing to the semiconductor module 2.

For this reason, with the semiconductor device 10 according to the first embodiment, the resistances Rm1 and Rm2 are set at 10% or less of the resistance Ri and the inductances Lm1 and Lm2 are set at 10% or less of the inductance Li. This means that in the semiconductor device 10, the influence of the resistances Rm1 and Rm2 and inductances Lm1 and Lm2 of the busbars 3 and 4 is reduced.

Next, the relationship between the temperature difference between the semiconductor elements and the case and the power cycle life and the ratio of the resistances Rm1 and Rm2 (and the inductances Lm1 and Lm2) to the resistance Ri (and the inductance Li) will be described.

Figure 2B:
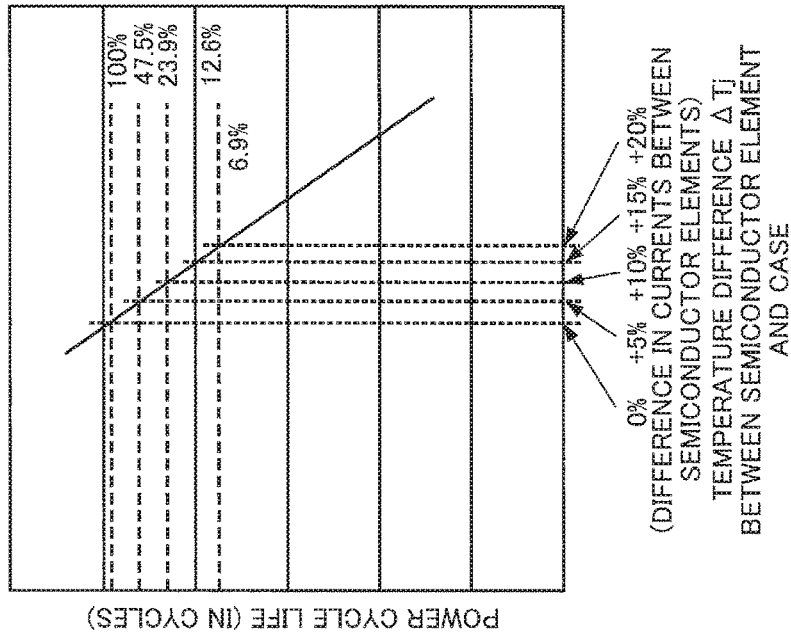
FIGS. 2A and 2B are graphs depicting a temperature difference between semiconductor elements and a case and a power cycle life according to the first embodiment.
Figure 2A:
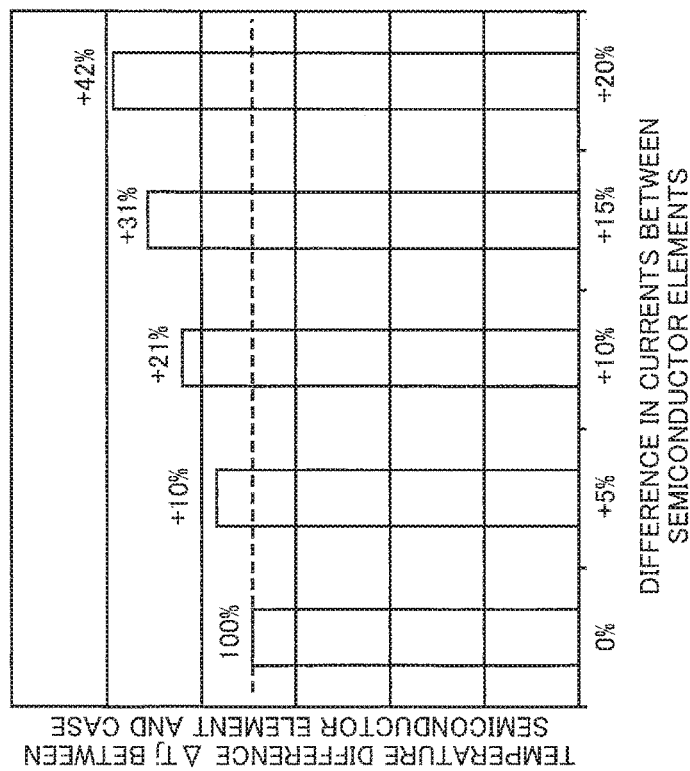

FIGS. 2A and 2B are graphs depicting the temperature difference between the semiconductor elements and the case and the power cycle life according to the first embodiment.

Note that in FIG. 2A, the horizontal axis represents the difference (%) in current between the semiconductor element 1a and the semiconductor element 2a and the vertical axis represents an absolute value of a temperature difference $\Delta Tj$ between the semiconductor element 2a and the case of the semiconductor module 2 when the temperature has increased. Note that on the vertical axis, $\Delta Tj$ for a case when the difference in current between the semiconductor element 1a and the semiconductor element 2a is 0% (that is, when there is no difference in current between the semiconductor element 1a and the semiconductor element 2a) is used as a standard (100%).

Also, in FIG. 2B, the horizontal axis represents relative values of $\Delta Tj$ described earlier and the vertical axis represents a value of the power cycle life (in cycles) of the semiconductor element 2a compared to the semiconductor element 1a, both using logarithms. Note that on the vertical axis, the power cycle life when the difference in current between the semiconductor element 1a and the semiconductor element 2a is 0% is used as a standard (100%).

The evaluation in FIG. 2A is performed as described below.

By supplying a current to the semiconductor elements 1a and 2a to be evaluated and changing the current value, a difference in current is produced between the semiconductor element 1a and the semiconductor element 2a. Note that the rated voltage of the semiconductor elements 1a and 2a is 1200V and the rated current is 100 A. The power supply connected to the semiconductor elements 1a and 2a has a voltage of 600V, a frequency of 15 kHz, and a power factor of 0.9.

Next, the temperature difference $\Delta Tj$ between the semiconductor element 2a and the case when the current flowing to the semiconductor element 2a has been increased by 5%, 10%, 15%, and 20% from a standard value (0%) is measured as examples of when the ratio of the difference in current between the semiconductor element 1a and the semiconductor element 2a is 0%, 5%, 10%, 15%, and 20%.

From the graph in FIG. 2A, it can be recognized that the temperature difference ΔTj increases in keeping with an increase in the difference in current between the semiconductor element 1a and the semiconductor element 2a. That is, FIG. 2A depicts that temperature of the semiconductor element 2a rises compared to the semiconductor element 1a.

Note that as described earlier, by reducing the resistances Rm1 and Rm2 and the inductances Lm1 and Lm2 of the busbars 3 and 4 in the semiconductor device 10, it is possible to reduce the difference between the currents of the semiconductor module 1 and the semiconductor module 2. That is, it can be said that as the ratio of the resistances Rm1 and Rm2 (the inductances Lm1 and Lm2) to the resistance Ri (the inductance Li) increases, the difference in current between the semiconductor element 1a and the semiconductor element 2a increases. Accordingly, from FIG. 2A, it is believed that the temperature difference ΔTj will increase as the resistances Rm1 and Rm2 (the inductances Lm1 and Lm2) increase.

The power cycle life (in cycles) of the semiconductor element 1a was evaluated for each temperature difference ΔTj depicted in FIG. 2A.

From the graph in FIG. 2B depicting the evaluation results, it can be recognized that as the temperature difference ΔTj increases, the power cycle life of the semiconductor element 2a becomes shorter. Note that each temperature difference ΔTj corresponds to a difference in current between the semiconductor element 1a and the semiconductor element 2a given in FIG. 2A. That is, these evaluation results indicate that as the difference in current between the semiconductor element 1a and the semiconductor element 2a increases, the power cycle life of the semiconductor element 2a becomes shorter.

In particular, when the difference in current between the semiconductor element 1a and the semiconductor element 2a is 10%, the power cycle life is reduced to around ¼ (23.9%) compared to when the difference in current is 0%. When the difference in current is 15%, the power cycle life is reduced to around ⅛ (12.6%) compared to when the difference in current is 0%. Here, a reduction to around ⅕ compared to the semiconductor module 1 is tolerated for the power cycle life of the semiconductor element 2a. For this reason, the ratio of the difference between the semiconductor element 1a and the semiconductor element 2a may be 10% or less.

Here, when a voltage is applied between the terminal portion 3a and the terminal portion 4a, the current flowing to the semiconductor element 1a is expressed as "I1" and the current flowing to the semiconductor element 2a is expressed as "I2", Expression (1) holds true.

$$I2 = ((Rm1 + Rm2)/2Ri) * I1 \quad (1)$$

That is, the difference in current between the semiconductor element 1a and the semiconductor element 2a equal to the ratio of the sum Rm1+Rm2 of the resistances of the busbar 3 and the busbar 4 to the respective sums 2Ri of the resistances of the wiring portions 1c, 1e, 2c, and 2e in the semiconductor modules 1 and 2. This means that to set the difference in current between the semiconductor element 1a and the semiconductor element 2a at 10% or less, the resistance (Rm1+Rm2) of the busbars 3 and 4 may be 10% or less of the resistance (2Ri) of the wiring portions 1c, 1e, 2c, and 2e of the semiconductor modules 1 and 2.

Note that Expression (1) also holds true for inductance. This means that to set the difference in current between the semiconductor element 1a and the semiconductor element 2a at 10% or less, the inductance (Lm1+Lm2) of the busbars 3 and 4 may be 10% or less of the inductance (2Li) of the wiring portions 1c, 1e, 2c, and 2e of the semiconductor modules 1 and 2.

Note that to set the power cycle life of the semiconductor element 2a at around one half of the semiconductor element 1a, it is more preferable to set the difference in resistance and inductance of the busbar 3 and the busbar 4 at 5% or less relative to the resistance and inductance of the wiring portions 1c, 1e, 2c, and 2e of the semiconductor modules 1 and 2.

According to the embodiment described above, it is possible to suppress a reduction in the life of the semiconductor device 10 and to improve the reliability of the semiconductor device.

Second Embodiment

In this second embodiment, the semiconductor device according to the first embodiment is described in more detail.

Figure 3A:
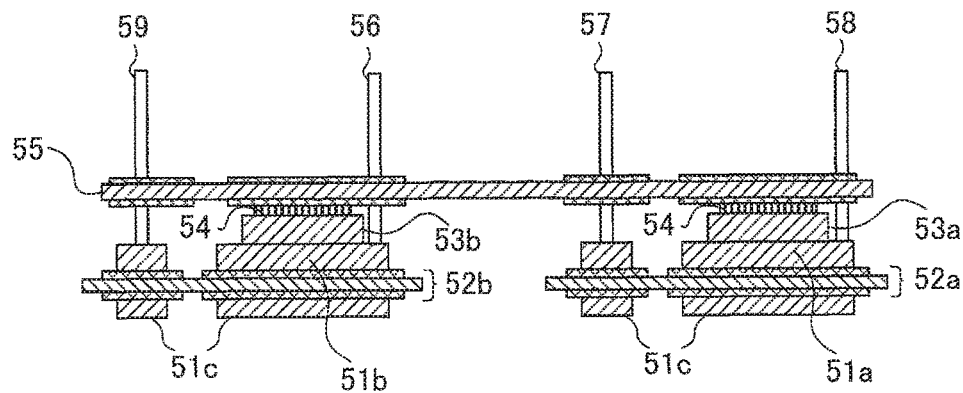
FIGS. 3A, 3B, and 3C depict a semiconductor module according to a second embodiment.
Figure 3B:
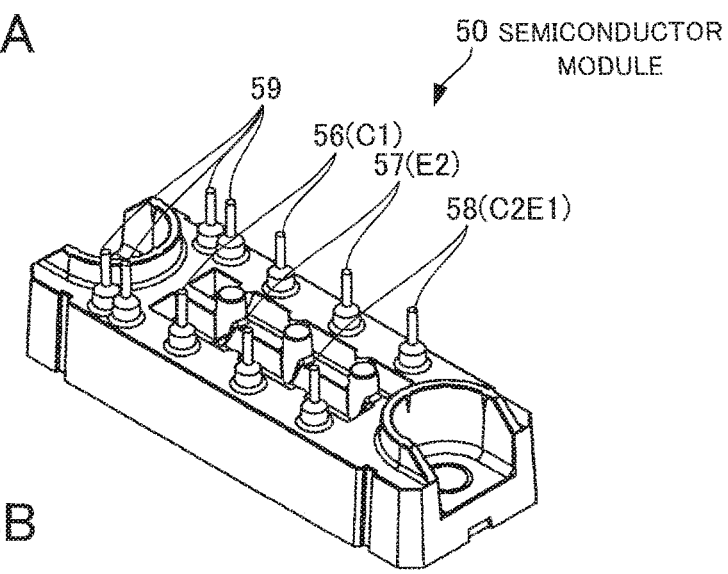
Figure 3C:
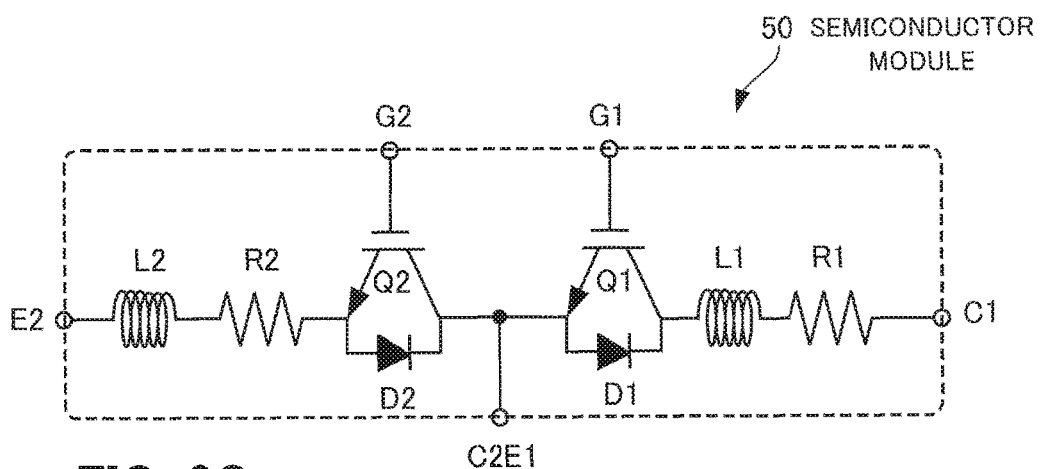

FIGS. 3A, 3B, and 3C depict one example of a semiconductor module according to the second embodiment.

Note that FIG. 3A is a side view of a configuration including a semiconductor module 50, FIG. 3B is a perspective view of the semiconductor module 50, and FIG. 3C is a circuit diagram of the semiconductor module 50.

As depicted in FIG. 3A, the semiconductor module 50 is equipped with semiconductor chips 53a and 53b, insulated substrates 52a and 52b, conductive posts 54, a printed circuit board 55, and terminals 56 to 59. The semiconductor chips 53a and 53b are IGBTs or power semiconductors such as power MOSFETs or FWD. Note that FIG. 3A depicts only single semiconductor chips 53a and 53b respectively mounted on the insulated substrates 52a and 52b. In reality, switching devices, such as IGBT, and FWD are disposed on circuit boards on front surface sides of the insulated substrates 52a and 52b so as to configure the equivalent circuits depicted in FIG. 3C.

The insulated substrates 52a and 52b are constructed of a ceramic substrate of alumina or the like with favorable heat resistance and a circuit board and a metal plate that are composed of a conductive material, such as copper, and are disposed on front and rear surfaces of the ceramic substrate. A predetermined circuit pattern is formed in the circuit board on the front side. As examples, the insulated substrates 52a and 52b are DCB (Direct Copper Bonding) boards or AMB (Active Metal Blazing) substrates. Note that as depicted in FIG. 3A, copper plates 51a and 51b that increase heat dissipation may be disposed between the insulated substrates 52a and 52b and the semiconductor chips 53a and 53b.

The printed circuit board 55 is disposed facing the circuit boards of the insulated substrates 52a and 52b. The printed circuit board 55 has a metal layer used for wiring.

The cylindrical conductive posts 54 are connected at one end to the metal layer of the printed circuit board 55 and are connected at the other end to the circuit boards of the semiconductor chips 53a and 53b and/or the insulated substrates 52a and 52b.

In this way, the insulated substrates 52a and 52b, the printed circuit board 55, and the conductive post 54 are used in a wiring portion of the semiconductor module 50.

In a conventional semiconductor module, bonding wires are commonly used in the wiring portion. However, it is difficult to lower the resistance and inductance of the wiring portion when connections are made using bonding wires that are thin.

On the other hand, when conductive posts and printed circuit boards are used in the wiring portion as described in the second embodiment, it is possible to increase the cross-sectional area of wiring compared to bonding wires and thereby lower the resistance and inductance of the wiring portion. Also, by disposing metal layers so as to be antiparallel on both surfaces of printed circuit boards, it is possible to further reduce the inductance of the wiring portion.

As depicted in the circuit diagram in FIG. 3C, in the semiconductor module 50, an antiparallel circuit composed of a switching device (hereinafter, simply "transistor") Q1 and an FWD (hereinafter simply "diode") D1 and an antiparallel circuit composed of a transistor Q2 and a diode D2 are connected in series. In addition, the wiring of the circuit described above has internal resistances R1 and R2 and internal inductances L1 and L2.

Here, the semiconductor chips 53a and 53b disposed on the insulated substrates 52a and 52b may be configured so as to be equivalent to the antiparallel circuits including the transistors Q1 and Q2 and the diodes D1 and D2 depicted in FIG. 3C. To do so, one or both of the expressions "transistors Q1 and Q2" and "diodes D1 and D2" may refer to the mounting of a plurality of semiconductor chips of the same rating.

A collector electrode of the transistor Q1 is disposed on the lower surface of the semiconductor chip 53a and a terminal 56 that is a collector terminal C1 of the semiconductor module 50 is connected via a circuit board. A terminal 58 that is a collector/emitter terminal C2/E1 is also connected via a circuit board to a collector electrode of the transistor Q2 that is disposed on the rear surface of the other semiconductor chip 53b. Emitter electrodes and gate electrodes of the transistors Q1 and Q2 are disposed on the front surface of the semiconductor chips 53a and 53b and are respectively connected to the printed circuit board 55 via the conductive posts 54. Out of such electrodes, the emitter electrode of the transistor Q1 is connected to the terminal 58 via a conductive post 54 and the printed circuit board 55 and the emitter electrode of the transistor Q2 is connected to the terminal 57 that is an emitter terminal E2 via a conductive post or the printed circuit board 55.

The terminals 56 to 58 are disposed as opposing pairs on the semiconductor module 50 as depicted in FIG. 3B. In addition to the terminals 56 to 58, the semiconductor module 50 further includes four terminals 59 with protruding front ends. Two out of such terminals 59 are gate terminals G1 and G2 that supply gate control signals to the gate electrodes of the transistors Q1 and Q2 of a half-bridge circuit and are connected to the printed circuit board 55. The other two terminals 59 are control (auxiliary) terminals and construct test terminals (not illustrated in FIG. 3C) that output sensing signals for sensing the collector-emitter currents of the transistors Q1 and Q2. That is, the terminals 56 to 58 are main terminals through which the main current of the semiconductor module 50 flows and the terminals 59 are control terminals for controlling the semiconductor module 50.

As one example, the respective component elements of the semiconductor module 50 are molded from and protected by thermosetting resin, such as an epoxy resin. As a whole, the semiconductor module 50 is a rectangular solid, as depicted in FIG. 3B. End portions of the ten terminals 56 to 59 protrude from the upper surface of the semiconductor module 50. On the base surface of the semiconductor module 50, copper plates 51c and 51d are disposed so as to be flush, corresponding to the metal plates on the bottom surface side of the insulated substrates 52 and 53.

Next, a semiconductor device constructed using the semiconductor module 50 described above will be described with reference to FIG. 4.

Figure 4:
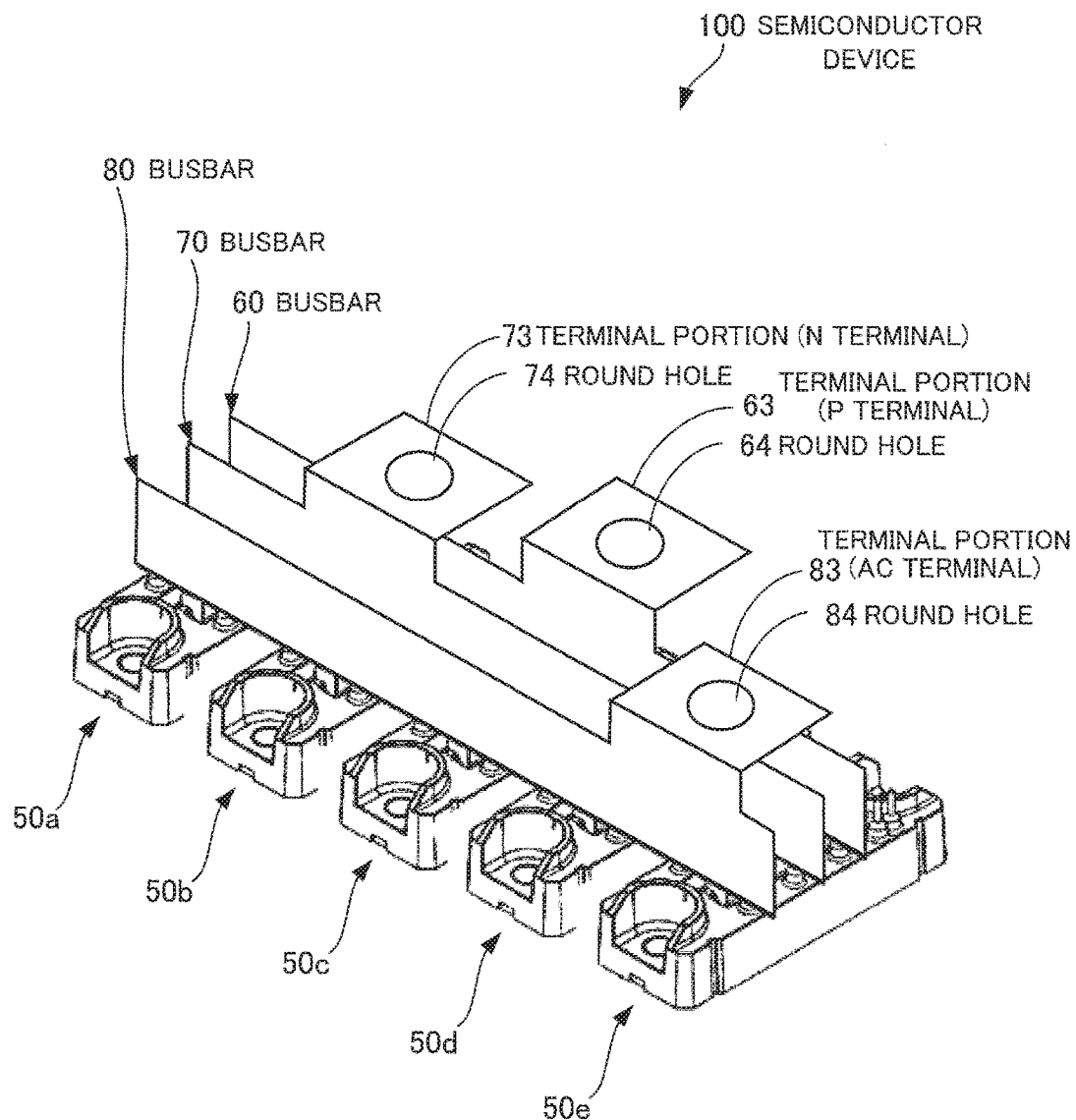
FIG. 4 is a perspective view depicting a semiconductor device according to the second embodiment.

FIG. 4 is a perspective view depicting the semiconductor device according to the second embodiment.

Note that semiconductor modules 50a to 50e depicted in FIG. 4 have the same configuration as the semiconductor module 50. The expression "semiconductor module 50" is a general name for the semiconductor modules 50a to 50e.

A semiconductor device 100 includes the five semiconductor modules 50a to 50e disposed with the same orientation.

The semiconductor device 100 also includes a busbar 60 that electrically connects the terminals 56 that are main terminals of the semiconductor modules 50a to 50e together, a busbar 70 that electrically connects the terminals 57 that are main terminals of the semiconductor modules 50a to 50e together, and a busbar 80 that electrically connects the terminals 58 that are main terminals of the semiconductor modules 50a to 50e together.

The busbars 60, 70, and 80 are respectively equipped with a terminal portion 63 (P terminal), a terminal portion 73 (N terminal), and a terminal portion 83 (AC terminal) provided with round holes 64, 74, and 84. A power supply is connected to the terminal portions 63, 73, and 83 from the outside.

FIGS. 5A, 5B, 5C, and 5D depict a busbar according to the second embodiment.

Figure 5A:
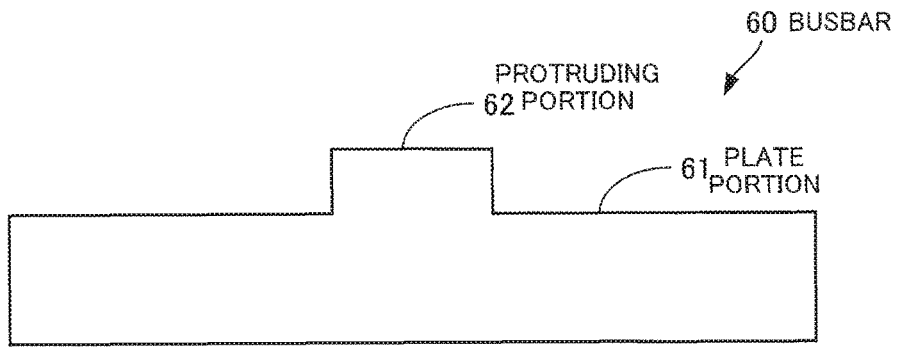
FIGS. 5A, 5B, 5C, and 5D depict a busbar according to the second embodiment.
Figure 5B:
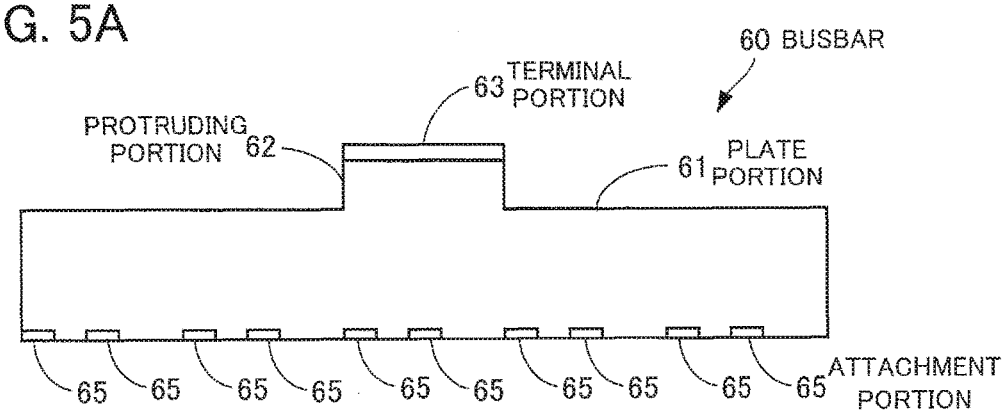
Figure 5C:
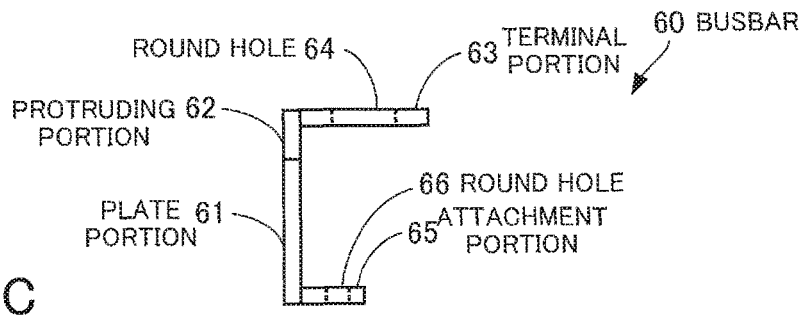
Figure 5D:
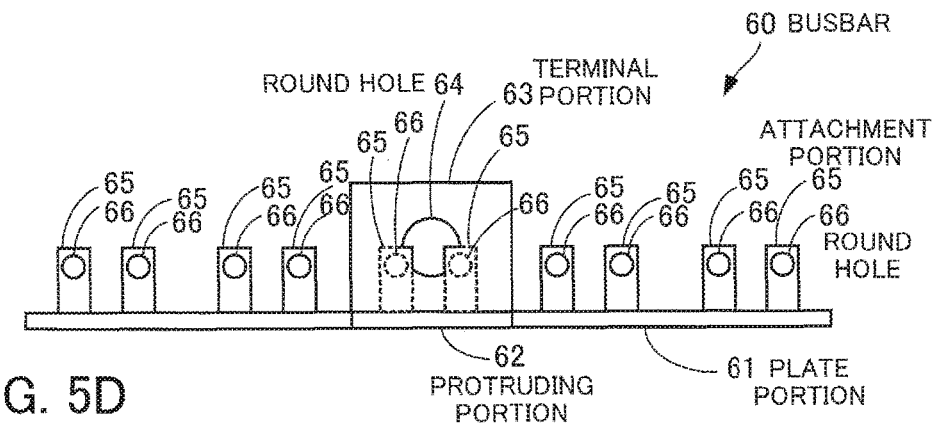

Note that FIGS. 5A, 5B, 5C, and 5D depicts the busbar 60 as an example, where FIG. 5A is a front view, FIG. 5B is a rear view on the opposite side to FIG. 5A, FIG. 5A is a side view, and FIG. 5D is an overhead view.

The busbar 60 includes a plate portion 61 provided with a protruding portion 62, a terminal portion 63 provided at the front end of the protruding portion 62, and a plurality of attachment portions 65 provided on a lower end side of the plate portion 61. The round hole 64 is provided in the terminal portion 63 and a round hole 66 is provided in the terminal portion 65. The terminal portion 63 and the attachment portions 65 are disposed so as to be substantially perpendicular to the plate portion 61.

Although the positions of the protruding portions and terminal portions are respectively different as depicted in FIG. 4, the busbars 70 and 80 have the same configuration as the busbar 60.

The terminals 56 of the five semiconductor modules 50a to 50e aligned in a row are inserted through the corresponding round holes 66 of the attachment portions 65 of the busbar 60 so as to protrude. The terminals 56 that protrude from the round holes 66 are then soldered to the attachment portions 65 so as to electrically connect the busbar 60 and the semiconductor modules 50a to 50e. The busbars 70 and 80 are connected in the same way to the terminals 57 and 58 of the semiconductor modules 50a to 50e to construct the semiconductor device 100.

Figure 6:
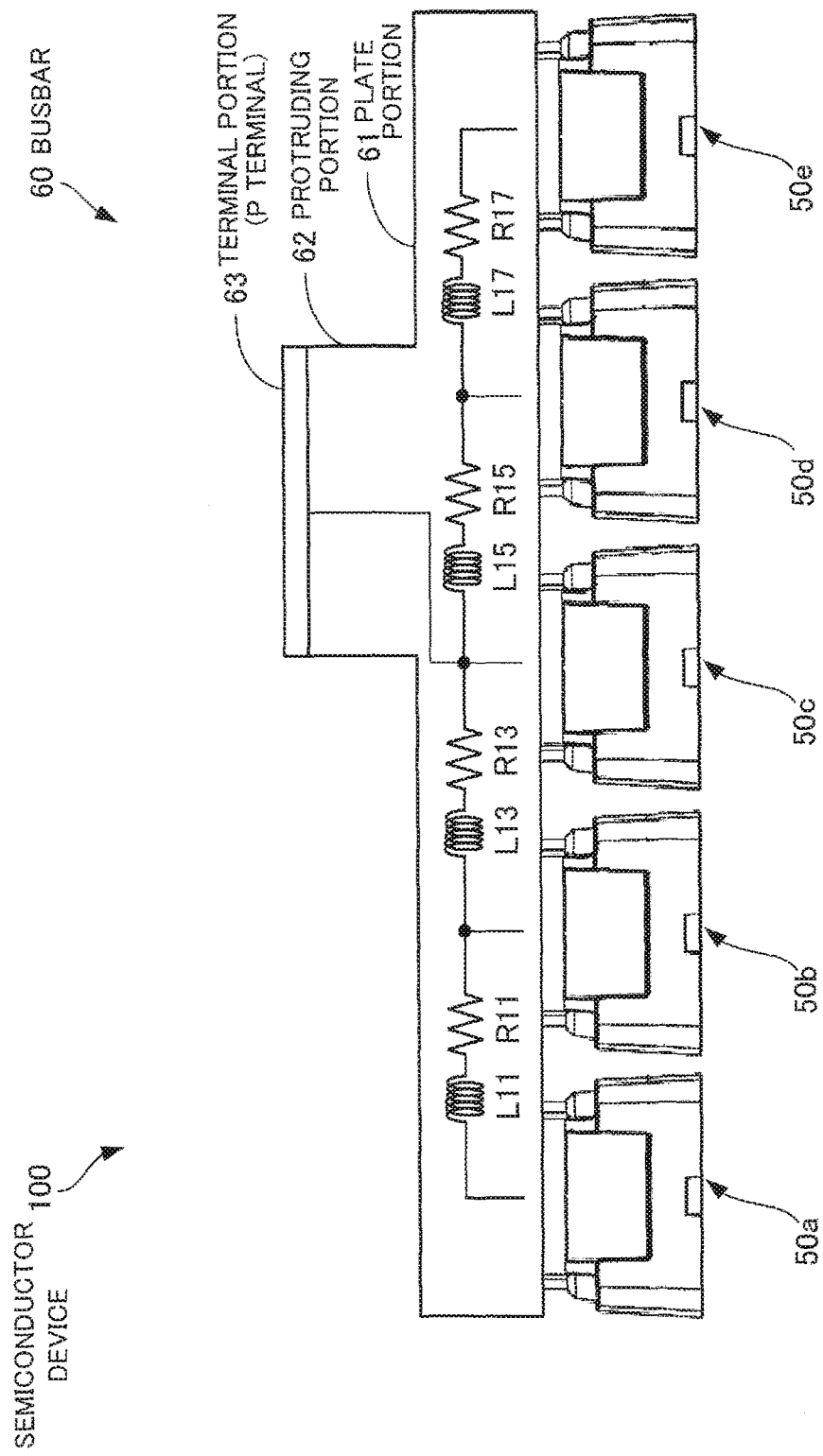
FIG. 6 depicts a busbar that connects semiconductor modules in parallel according to the second embodiment.

FIG. 6 depicts a busbar that connects semiconductor modules in parallel according to the second embodiment.

Resistances R11, R13, R15, and R17 and inductances L11, L13, L15, and L17 are present on the busbar between the semiconductor modules 50a to 50e. The terminal portion 63 of the busbar 60 is connected to a node between the resistance R13 and the resistance R15 and the resistance and inductance between the terminal portion 63 and an attachment portion of the semiconductor module 50c is negligible.

Although not illustrated, the busbar 70 also has internal resistances and inductances between the respective semiconductor modules 50 in the same way.

Note that as one example, the busbars 60 and 70 use a conductive material such as a copper alloy. The size (length, height, and thickness) of the busbars 60 and 70 is selected so as to minimize the resistance and inductance of the busbars 60 and 70.

By disposing the busbars 60 and 70 in parallel as depicted in FIG. 4, it is possible to reduce the inductances present in the busbar 60 and the busbar 70.

Figure 7:
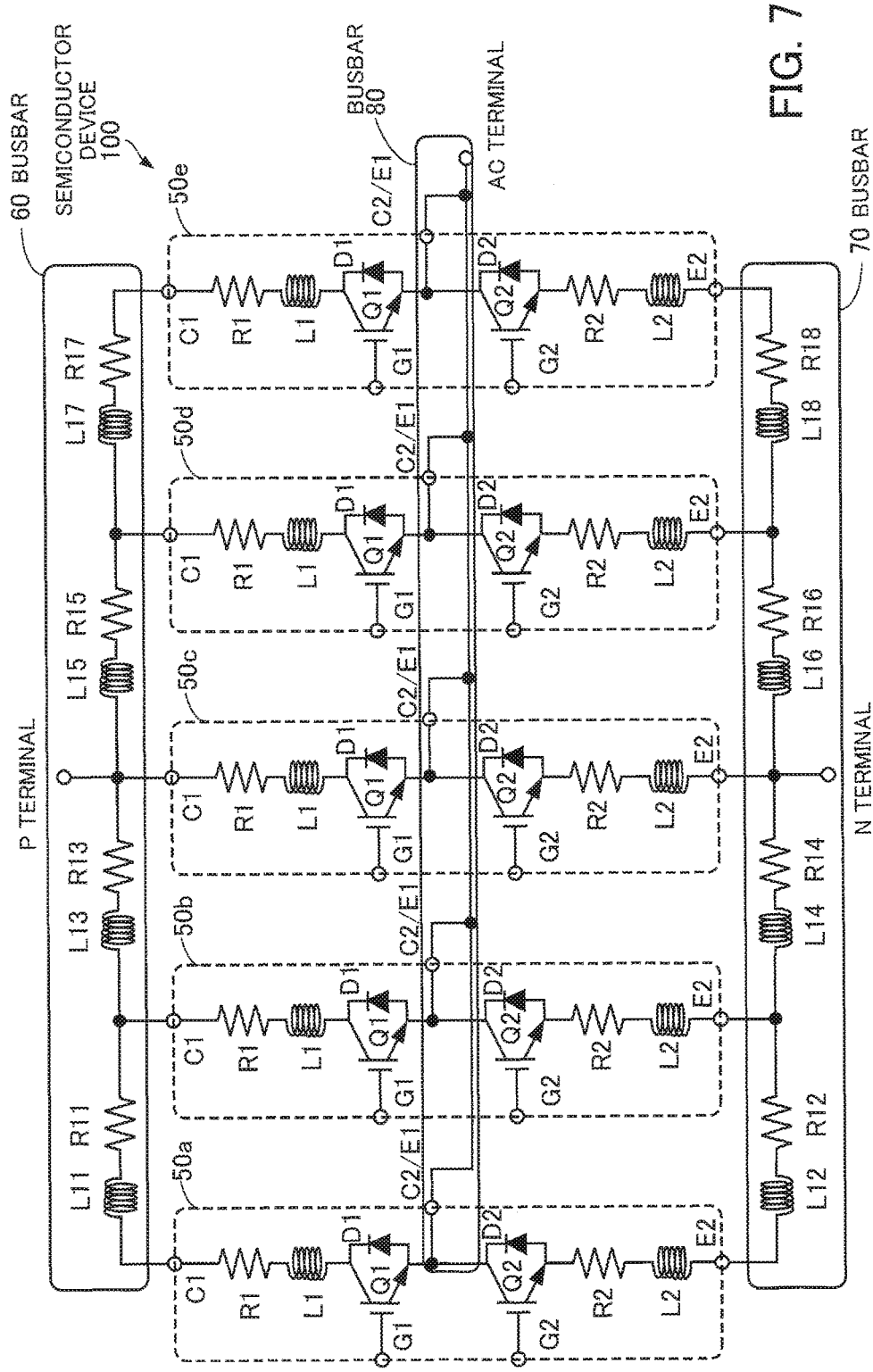
FIG. 7 depicts a circuit configured by the semiconductor device according to the second embodiment.

FIG. 7 depicts a circuit configured by the semiconductor device according to the second embodiment.

In the semiconductor device 100, the semiconductor modules 50a to 50e are connected in parallel.

The respective collector terminals C1 of the semiconductor modules 50a to 50e are connected by the busbar 60. The respective emitter terminals E2 of the semiconductor modules 50a to 50e are connected by the busbar 70. In addition, the respective collector/emitter terminals C2/E1 are connected by the busbar 80.

As described earlier, the resistances R11, R13, R15, and R17 and the inductances L11, L13, L15, and L17 are present on the busbar 60 between the collector terminals C1 of the semiconductor modules 50a to 50e. In the same way, the resistances R12, R14, R16, and R18 and the inductances L12, L14, L16, and L18 are present on the busbar 70 between the emitter terminals E2 of the semiconductor modules 50a to 50e.

With the circuit configuration described above, the resistances and inductances from the terminal portions (N terminal, P terminal) to the respective attachment portions on the busbar 60 and the busbar 70 connected to the semiconductor modules 50a to 50e are as indicated below.

The resistance of the busbar connected to the semiconductor module 50a is R11+R12+R13+R14 and the inductance is L11+L12+L13+L14.

The resistance of the busbar connected to the semiconductor module 50b is R13+R14 and the inductance is L13+L14.

The resistance and the inductance of the busbar connected to the semiconductor module 50c are negligibly small.

The resistance of the busbar connected to the semiconductor module 50d is R15+R16 and the inductance is L15+L16.

The resistance of the busbar connected to the semiconductor module 50e is R15+R16+R17+R18 and the inductance is L15+L16+L17+L18.

That is, out of the resistances between the terminal portions of the semiconductor modules 50a to 50e and the respective attachment portions, the largest resistance is either R11+R12+R13+R14 (for the semiconductor module 50a) or R15+R16+R17+R18 (for the semiconductor module 50e). Here, the largest resistance described above is set at 10% or less of the resistance R1+R2 of the wiring portions of the semiconductor modules 50. By doing so, all of the resistances from the terminal portions to the attachment portions on the busbars connected to the semiconductor modules 50a to 50e will be 10% or less of the resistance of the wiring portions of the semiconductor modules 50.

Out of the inductances between the terminal portions of the semiconductor modules 50a to 50e and the respective attachment portions, the highest inductance is either L11+L12+L13+L14 (for the semiconductor module 50a) or L15+L16+L17+L18 (for the semiconductor module 50e). The largest inductance described above is also set at 10% or less of the inductance L1+L2 of the wiring portions of the semiconductor modules 50. By doing so, all of the inductances from the terminal portions to the attachment portions on the busbars connected to the semiconductor modules 50a to 50e will be 10% or less of the inductance of the wiring portions of the semiconductor modules 50.

By doing so, in the same way as the first embodiment, it is possible to set the difference between the currents flowing in the semiconductor modules 50a to 50e at 10% or less. This means that it is possible to avoid a shortening of the life of the semiconductor device 100 and to improve reliability.

As a specific example, a case where semiconductor modules 50 where the resistance of the wiring portion is 0.6mΩ and the inductance is 15 nH are connected in parallel is described below.

Here, it is assumed that the width of the busbar 60 from the terminal portion to the attachment portion with the largest resistance and inductance is 44 mm, the height is 30 mm, and the thickness is 1 mm, and that the distance to the busbar 70 disposed in parallel is 1 mm. In this case, the resistance from the terminal portion to the attachment portion of the busbar 60 is 48Ω and the inductance is 2 nH.

With this example, the difference between the highest resistance and the lowest resistance out of the resistances between the terminal portion and the respective attachment portions is 25nΩ or less. The difference between the highest inductance and the lowest inductance is 2 nH or less.

By doing so, it is possible to set the resistance and inductance of the busbar at 10% or less of the resistance and inductance of the wiring portions, and thereby possible to set the difference between the currents flowing in the respective semiconductor modules at 10% or less.

In addition, if the height of the busbars described above is set at 60 mm, the resistance from the terminal portion to the attachment portion of the busbar becomes 0.59Ω and the inductance becomes 1 nH.

This is more favorable since by doing so, the resistance and inductance of the busbar can be set at 5% or less of the resistance and inductance of the wiring portions and the difference between the currents flowing in the respective semiconductor modules can be set at 5% or less.

According to the disclosed technology, differences in currents applied to semiconductor modules are reduced and a drop in performance of a semiconductor device is avoided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a plurality of semiconductor modules, each including
      a semiconductor element,
      a main terminal that is exposed to a periphery, and
      a wiring portion that connects the semiconductor element and the main terminal; and
   at least one busbar that each includes
      a terminal portion, and
      a plurality of attachment portions,
   the attachment portions being respectively connected to the main terminals of the semiconductor modules, such that the at least one busbar connects the semiconductor modules in parallel, wherein a largest resistance among all resistances between the terminal portion and each of the attachment portions in each busbar is 10% or less of a resistance of the wiring portion in each semiconductor module, and a largest inductance among all inductances between the terminal portion and each of the attachment portions in each busbar is 10% or less of an inductance of the wiring portion in each semiconductor module.

2. The semiconductor device according to claim 1, wherein the largest resistance among all resistances between the terminal portion and each of the attachment portions in each busbar is 5% or less of the resistance of the wiring portion in each semiconductor module, and the largest inductance among all inductances between the terminal portion and each of the attachment portions in each busbar is 5% or less of the inductance of the wiring portion in each semiconductor module.

3. The semiconductor device according to claim 1, wherein the wiring portion in each semiconductor module includes an insulated substrate, a printed circuit board that faces the insulated substrate, and a conductive post that is connected to the printed circuit board.

4. The semiconductor device according to claim 3, wherein in each semiconductor module the main terminal is connected to the insulated substrate and/or the printed circuit board.

5. The semiconductor device according to claim 1, wherein the main terminal in each semiconductor module includes a first main terminal and a second main terminal, and the at least one busbar includes a first busbar and a second busbar, which are in parallel to each other, and are respectively connected to the first and second main terminals of each semiconductor module.

6. The semiconductor device according to claim 5, wherein the first and second busbars have a gap therebetween that has a width of 1 mm or less.

7. A busbar for connecting a plurality of semiconductor modules in parallel with another busbar connecting the plurality of semiconductor modules, a gap between the busbar and the another busbar being 1 mm or less, the busbar comprising:

a terminal portion, and a plurality of attachment portions, via which the plurality of semiconductor modules are connectable in parallel to the busbar, wherein a difference between a largest resistance and a smallest resistance among all resistances between the terminal portion and each of the attachment portions is 25nQ or less, and a difference between a largest inductance and a smallest inductance among all inductances between the terminal portion and each of the attachment portions is 2 nH or less.

8. The busbar according to claim 7, wherein the difference between the largest inductance and the smallest inductance among all inductances between the terminal portion and each of the attachment portions is 1 nH or less.

* * * * *